United States Patent
Lee et al.

(10) Patent No.: US 12,289,851 B2
(45) Date of Patent: Apr. 29, 2025

(54) WATERPROOF GATE ASSEMBLY AND ELECTRONIC DEVICE

(71) Applicant: Getac Technology Corporation, New Taipei (TW)

(72) Inventors: Kun-Cheng Lee, Taipei (TW); Juei-Chi Chang, Taipei (TW)

(73) Assignee: Getac Technology Corporation, New Taipei (TW)

( * ) Notice: Subject to any disclaimer, the term of this patent is extended or adjusted under 35 U.S.C. 154(b) by 133 days.

(21) Appl. No.: 17/980,619

(22) Filed: Nov. 4, 2022

(65) Prior Publication Data

US 2023/0262915 A1    Aug. 17, 2023

Related U.S. Application Data

(60) Provisional application No. 63/309,093, filed on Feb. 11, 2022.

(30) Foreign Application Priority Data

Aug. 18, 2022   (CN) .......................... 202210994410.7

(51) Int. Cl.
    *H05K 5/00*    (2025.01)
    *H05K 5/06*    (2006.01)
(52) U.S. Cl.
    CPC ............. *H05K 5/06* (2013.01); *H05K 5/0095* (2013.01); *H05K 5/061* (2013.01)
(58) Field of Classification Search
    CPC ......... H05K 5/06; H05K 5/0095; H05K 5/061
    (Continued)

(56) References Cited

U.S. PATENT DOCUMENTS 10,050,374 B1 *   8/2018   Lee ..................... G06F 1/1656
10,296,050 B2     5/2019   Shindo et al.
(Continued)

FOREIGN PATENT DOCUMENTS

CN    104582346 A    4/2015
CN    104750196 A1   7/2015
(Continued)

OTHER PUBLICATIONS

European Patent Office, Search Report, Jun. 23, 2023, Germany.
Taiwan Patent Office, "Office Action", Jan. 13, 2023, Taiwan.

*Primary Examiner* — Zhengfu J Feng
(74) *Attorney, Agent, or Firm* — Troutman Pepper Locke LLP; Tim Tingkang Xia, Esq.

(57) ABSTRACT

A waterproof gate assembly, which is configured to be mounted to a housing and includes a cover, an installation axle and a fixing member, is provided. The installation axle is connected to the cover, allowing the cover to rotate relative to the installation axle. The installation axle includes an axial groove, an engaging structure and a fixing structure. The axial groove is connected to the cover and includes a first end portion and a second end portion. The engaging structure is connected to one side of the axial groove corresponding to the cover, extends to the first end portion of the axial groove, and is configured to be engaged at the housing. The fixing structure is connected to one side of the axial groove corresponding to the cover, and close to the second end portion. The fixing member passes through the fixing structure and is fixed at the housing.

20 Claims, 9 Drawing Sheets

(58) Field of Classification Search
USPC .......................................................... 361/807
See application file for complete search history.

(56) References Cited

U.S. PATENT DOCUMENTS

| | | | |
|---|---|---|---|
| 2009/0109635 A1* | 4/2009 | Chen | G06F 1/1656 |
| | | | 361/728 |
| 2019/0179214 A1* | 6/2019 | Hara | H05K 5/03 |
| 2019/0341719 A1* | 11/2019 | Hoshika | H05K 5/03 |
| 2020/0337164 A1* | 10/2020 | Lee | H05K 5/03 |

FOREIGN PATENT DOCUMENTS

| | | |
|---|---|---|
| TW | 201511642 A | 3/2015 |
| WO | 2022063324 A1 | 3/2022 |

* cited by examiner

WATERPROOF GATE ASSEMBLY AND ELECTRONIC DEVICE

CROSS-REFERENCE TO RELATED APPLICATIONS

The application claims the benefit of a U.S. Provisional Patent Application No. 63/309,093, filed on Feb. 11, 2022, the disclosure of which is hereby incorporated by reference herein in its entirety. The application further claims priority to a Chinese Patent Application No. 202210994410.7, filed on Aug. 18, 2022, the disclosure of which is also hereby incorporated by reference herein in its entirety.

BACKGROUND OF THE INVENTION

Field of the Invention

The present invention relates to a waterproof gate assembly and an electronic device, and more particularly, to a waterproof gate assembly that can be easily maintained or replaced and an electronic device applying the waterproof gate assembly.

Description of the Prior Art

With the diversified functions offered by electronic devices, a body of an electronic device is commonly provided with multiple openings for connections of wires or expansion apparatuses. To achieve the object of being waterproof or dustproof of the openings, each opening is usually configured with a gate cover to allow a user to seal the opening when the opening is not in used.

In a commercially available structural design of a gate cover of such electronic device with numerous openings, two gate covers are connected to a same pivotal axle, which is then locked between two neighboring openings on the body, thereby reducing the number of pivotal axles required and the structural space used. One drawback of the structural design of the foregoing gate cover is that, gate covers of both sides need to be replaced in case of damage of either of the gate covers, resulting in wastes in resources. Moreover, the gate covers need to be individually designed corresponding to the openings of various models, and design modifications to one gate cover or opening alone cannot be made in the current structure of such gate covers. For similar models, the possibility of design modifications of one-sided openings is far higher than those of double-sided openings, such that design versatilities are greatly limited, and therefore there is a need for improvement.

SUMMARY OF THE INVENTION

The present invention provides a waterproof gate assembly configured to be mounted to a housing. The waterproof gate assembly includes a cover, an installation axle and a fixing member. The installation axle is connected to the cover, so that the cover is enabled to rotate relative to the installation axle. The installation axle includes an axial groove, an engaging structure and a fixing structure. The axial groove is connected to the cover and includes a first end portion and a second end portion. The engaging structure is connected to one side of the axial groove corresponding to the cover, extends to the first end portion of the axial groove, and is configured to be engaged at the housing. The fixing structure is connected to the one side of the axial groove corresponding to the cover, and is close to the second end portion of the axial groove. The fixing member passes through the fixing structure and is fixed at the housing.

Thus, each waterproof gate assembly can be separately mounted to the housing to better facilitate maintenance or replacement. Moreover, since two corresponding waterproof gate assemblies can occupy substantially the space of one pivotal axle, the structural space used can be reduced at the same time.

In some embodiments, the axial groove extends in an axial direction, the fixing member extends in a first radial direction perpendicular to the axial direction, the housing includes a first stop portion, the engaging structure abuts against the first stop portion, and the first stop portion limits, via the engaging structure, the displacement of the installation axle in the axial direction and the first radial direction.

In some embodiments, the first stop portion has an end surface and an opening, the opening is adjacent to the end surface, and the engaging structure is inserted into the opening.

In some embodiments, the first stop portion has a peripheral surface, and the peripheral surface is connected to a portion of the end surface and defines the opening.

In some embodiments, the peripheral surface has an arc section adjacent to the opening.

In some embodiments, the engaging structure has an inclined surface.

In some embodiments, the axial groove extends in an axial direction, the housing includes a second stop portion, the installation axle includes a concave portion, the second stop portion has an abutting surface, the concave portion abuts against the abutting surface, and the second stop portion limits, via the concave portion, the displacement of the installation axle in the axial direction.

In some embodiments, the concave portion is located on the other side of the installation axle and is away from the first end portion.

In some embodiments, the fixing member extends in a first radial direction perpendicular to the axial direction, a direction perpendicular to the axial direction and the first radial direction is defined as a second radial direction, the second stop portion includes a first part and a second part joined with each other, the first part is connected to the housing and extends in the first radial direction, the second part extends in the second radial direction, and the abutting surface is located at the second part.

In some embodiments, the housing includes a first stop portion and a second stop portion, the installation axle includes a concave portion, the engaging structure abuts against the first stop portion, and the concave portion abuts against the second stop portion.

The present invention further provides an electronic device including a housing and a waterproof gate assembly. The housing has a side cover. The waterproof gate assembly is mounted to the housing and includes a cover, an installation axle and a fixing member. The installation axle is connected to the cover, so that the cover is enabled to rotate relative to the installation axle. The installation axle includes an axial groove, an engaging structure and a fixing structure. The axial groove is connected to the cover, and includes a first end portion and a second end portion. The engaging structure is connected to one side of the axial groove corresponding to the cover, extends to the first end portion of the axial groove, and is configured to be caught at the side cover. The fixing structure is connected to the one side of the axial groove corresponding to the cover, and is close to the second end portion of the axial groove. The fixing member passes through the fixing structure and is fixed at the side cover.

In some embodiments, the housing further has a port, the waterproof gate assembly further includes a sealing plug, and the sealing plug is configured to seal the port.

In some embodiments, the waterproof gate assembly further includes a slide fastener, and the slide fastener is assembled on the cover.

The present invention further provides an electronic device including a housing and a waterproof gate assembly. The housing has a side cover. The waterproof gate assembly is mounted to the housing, and includes a cover and an installation axle. The installation axle is connected to the cover and fixed at the side cover, so that the cover is enabled to rotate relative to the installation axle. The installation axle includes an axial groove, an engaging structure and a fixing structure. The axial groove is connected to the cover, and includes a first end portion and a second end portion. The engaging structure is connected to one side of the axial groove corresponding to the cover, extends to the first end portion of the axial groove, and is configured to be caught at the side cover. The fixing structure is connected to the one side of the axial groove corresponding to the cover, and is close to the second end portion of the axial groove.

In some embodiments, the housing includes a first stop portion and a second stop portion, the installation axle includes a concave portion, the engaging structure abuts against the first stop portion, and the concave portion abuts against the second stop portion.

DETAILED DESCRIPTION OF THE EMBODIMENTS

Figure 1:
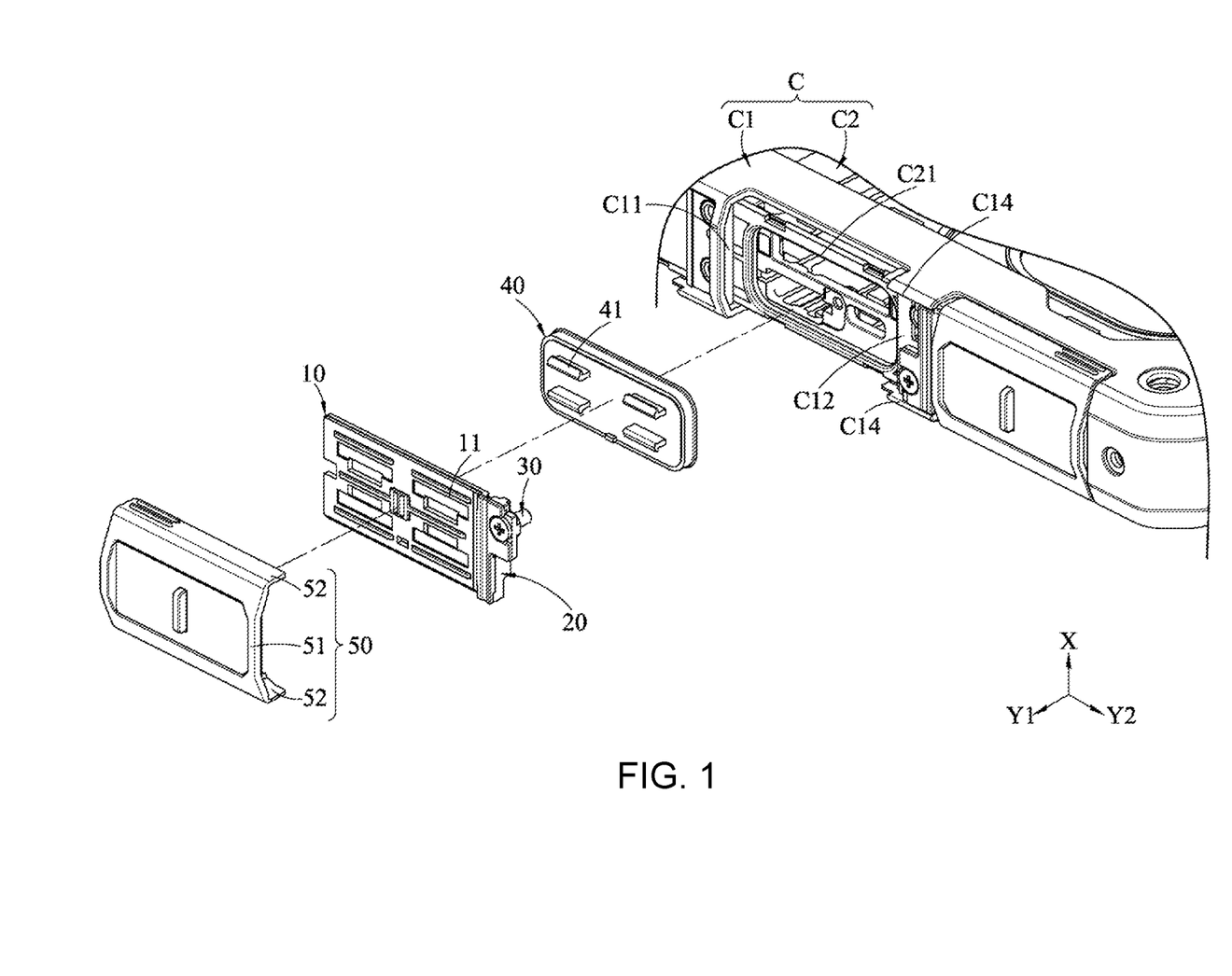
FIG. 1 is an exploded perspective structural schematic diagram of an electronic device including a waterproof gate assembly according to an embodiment of the present invention.
Figure 2:
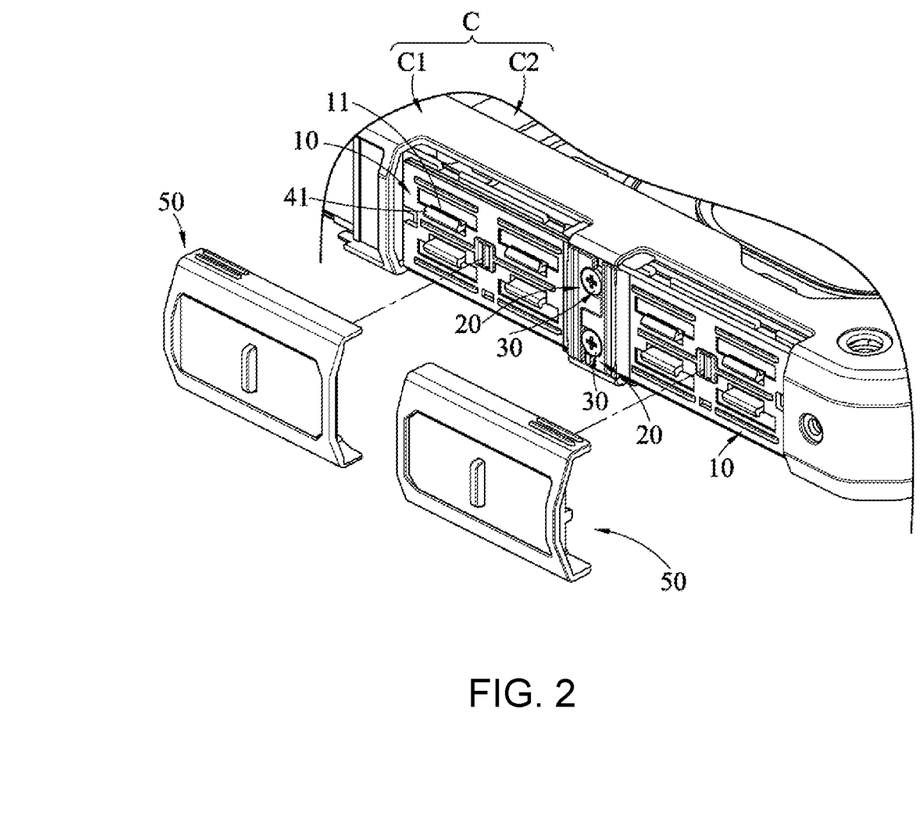
FIG. 2 is a first exploded perspective structural schematic diagram of a waterproof gate assembly in coordination with a housing according to an embodiment of the present invention.
Figure 3:
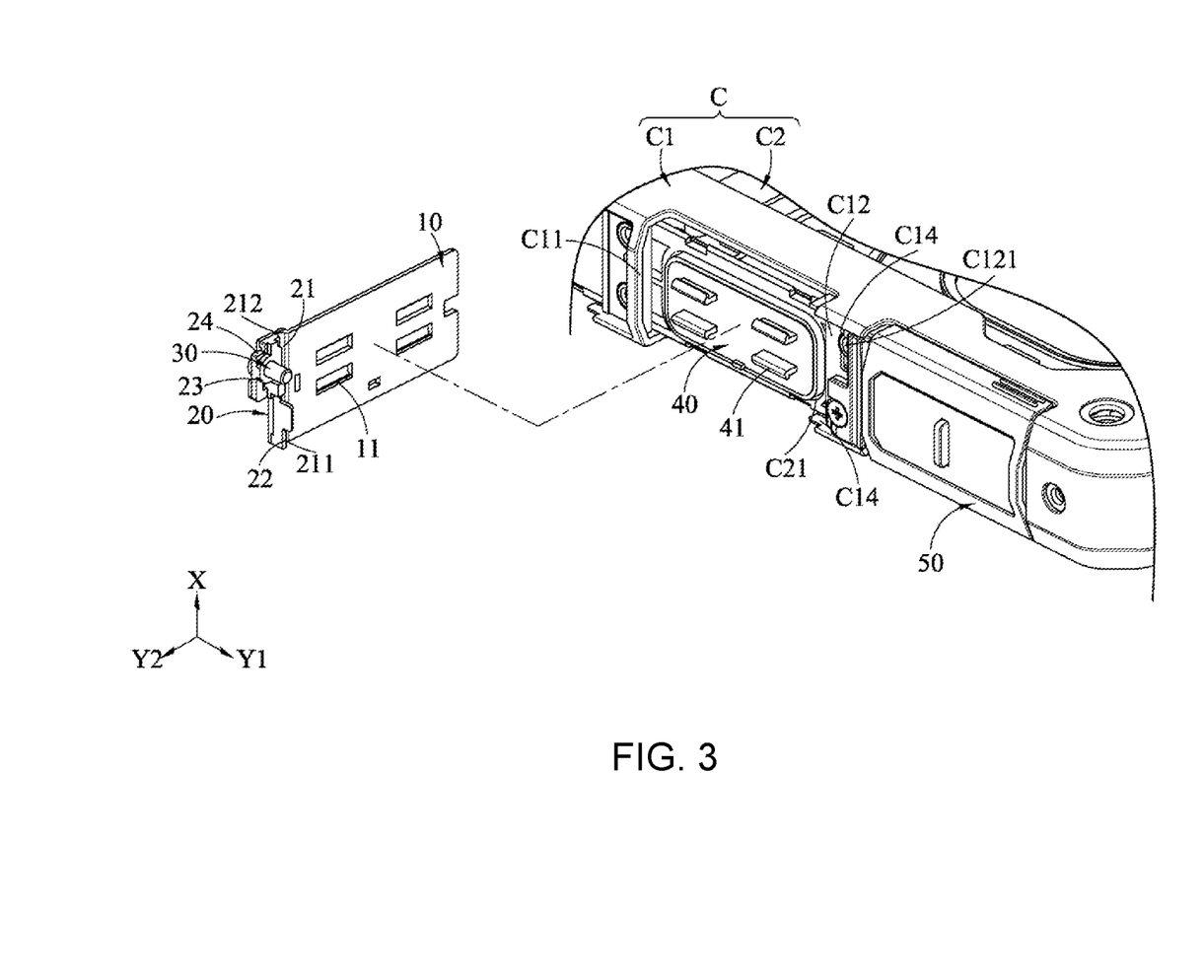
FIG. 3 is a second exploded perspective structural schematic diagram of a waterproof gate assembly in coordination with a housing according to an embodiment of the present invention.
Figure 4:
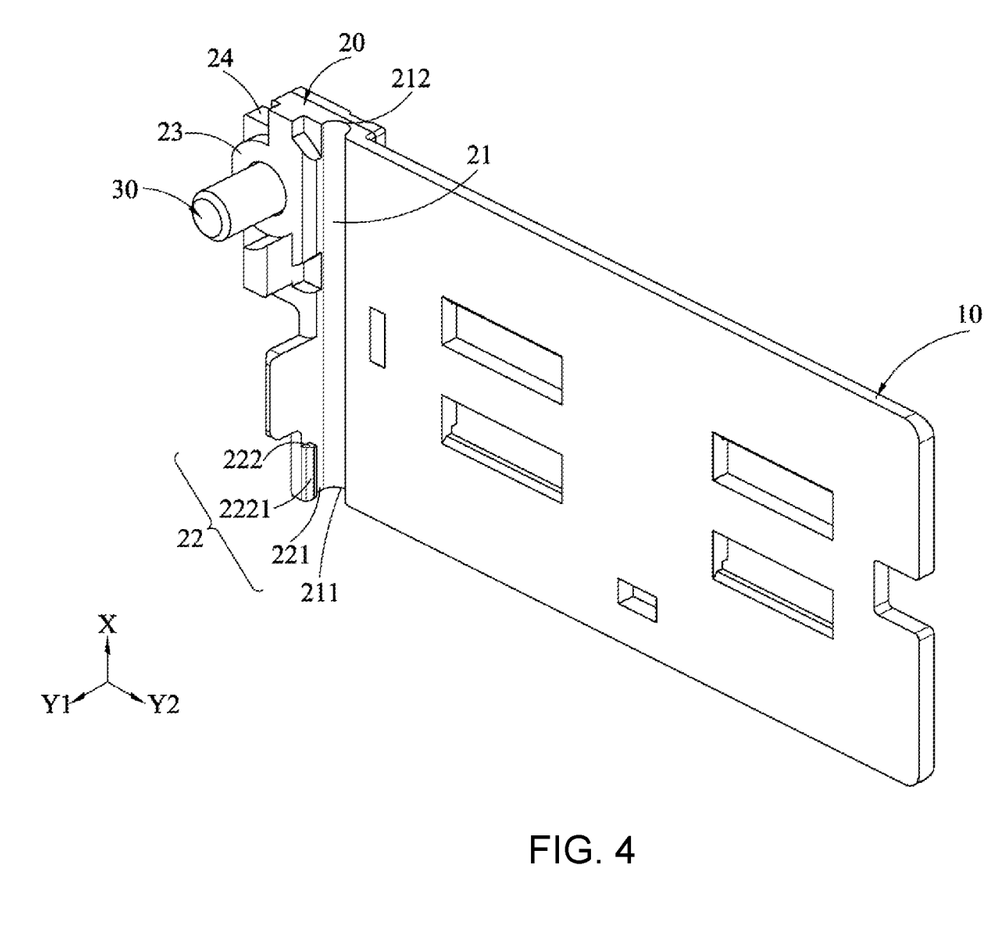
FIG. 4 is a perspective appearance schematic diagram of a waterproof gate assembly according to an embodiment of the present invention.
Figure 5:
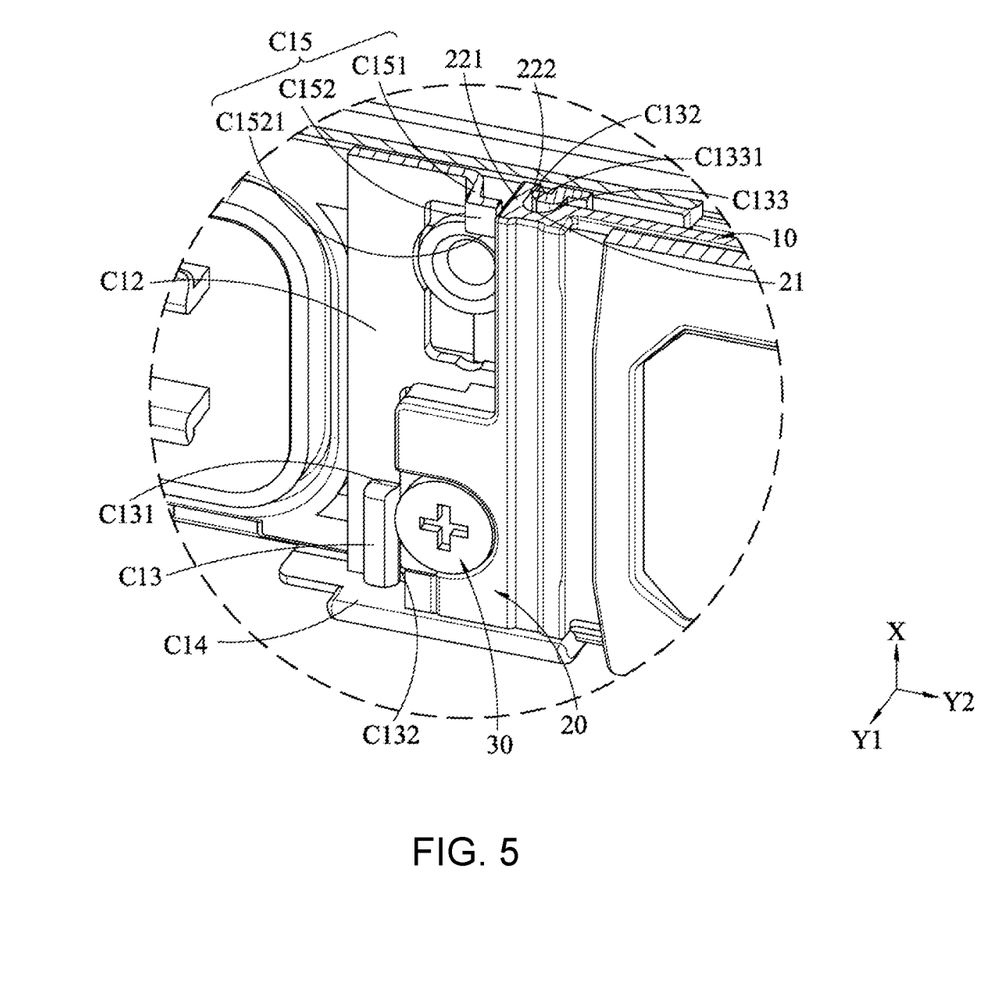
FIG. 5 is a partial structural schematic diagram of a waterproof gate assembly mounted to a housing according to an embodiment of the present invention.
Figure 6:
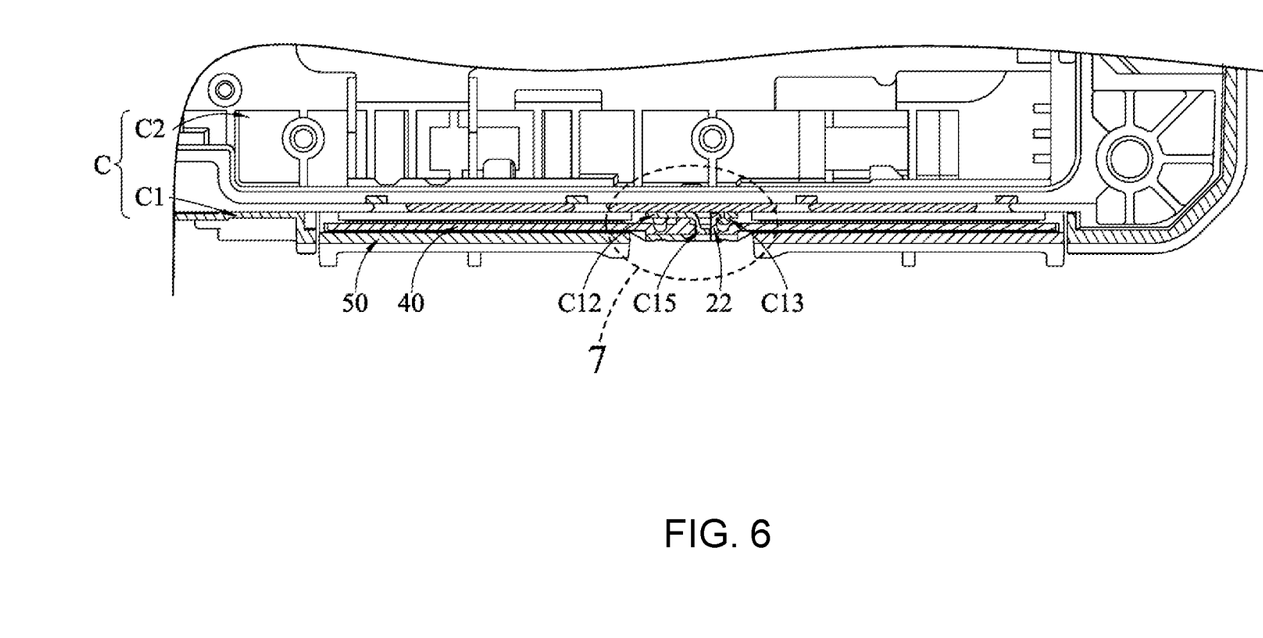
FIG. 6 is a section schematic diagram of a waterproof gate assembly mounted to a housing according to an embodiment of the present invention.
Figure 7:
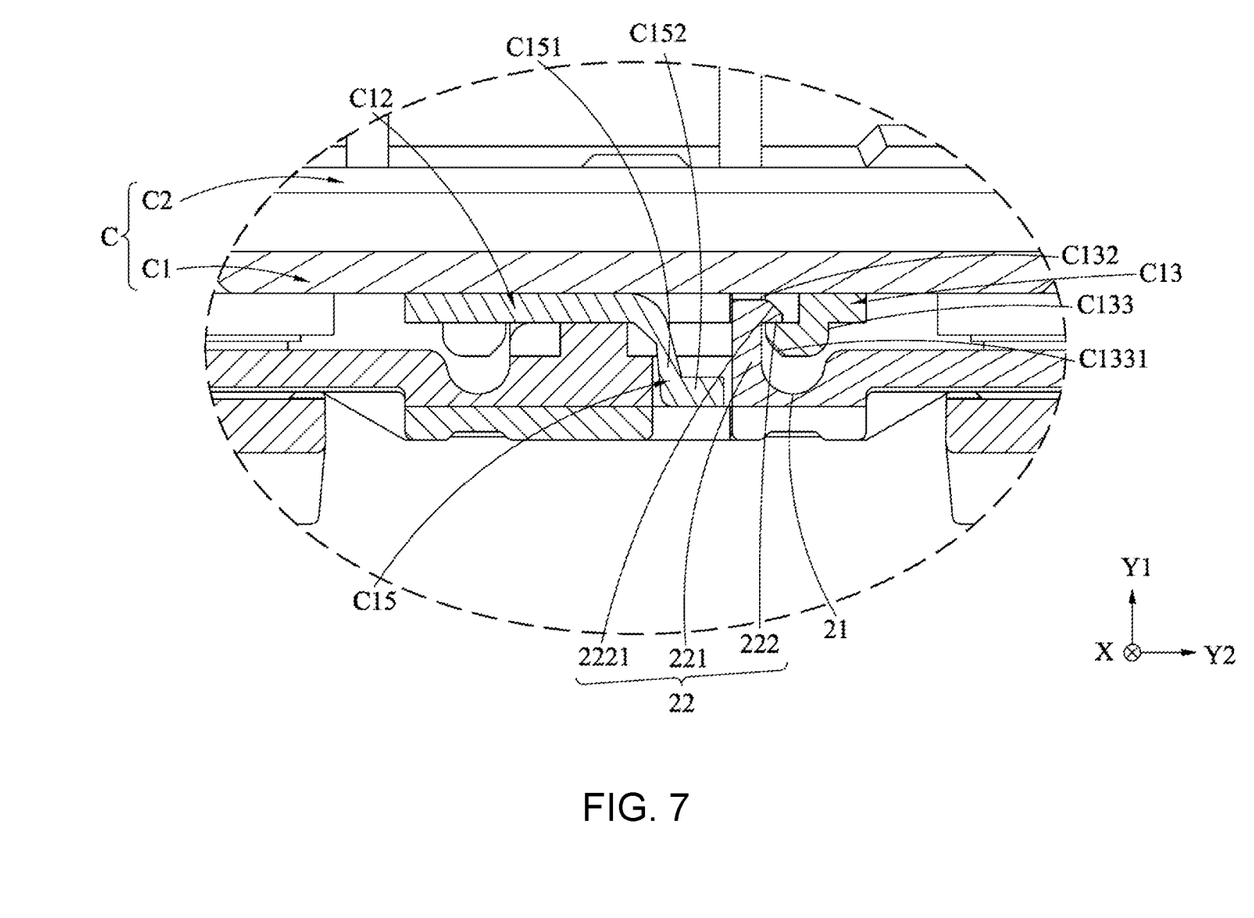
FIG. 7 is a partial enlarged schematic diagram of a circled portion 7 in FIG. 6.
Figure 8:
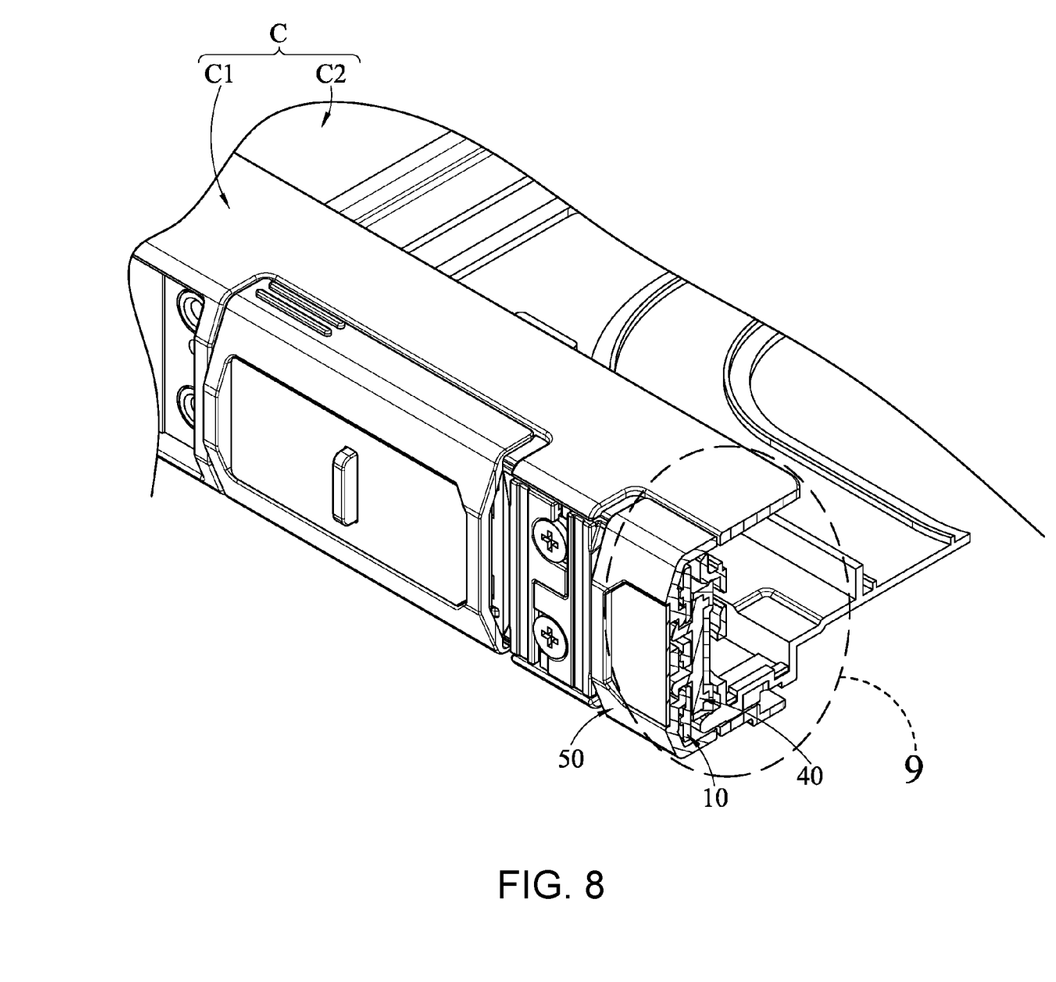
FIG. 8 is a perspective section schematic diagram of a waterproof gate assembly mounted in coordination with a slide fastener to a housing according to an embodiment of the present invention.
Figure 9:
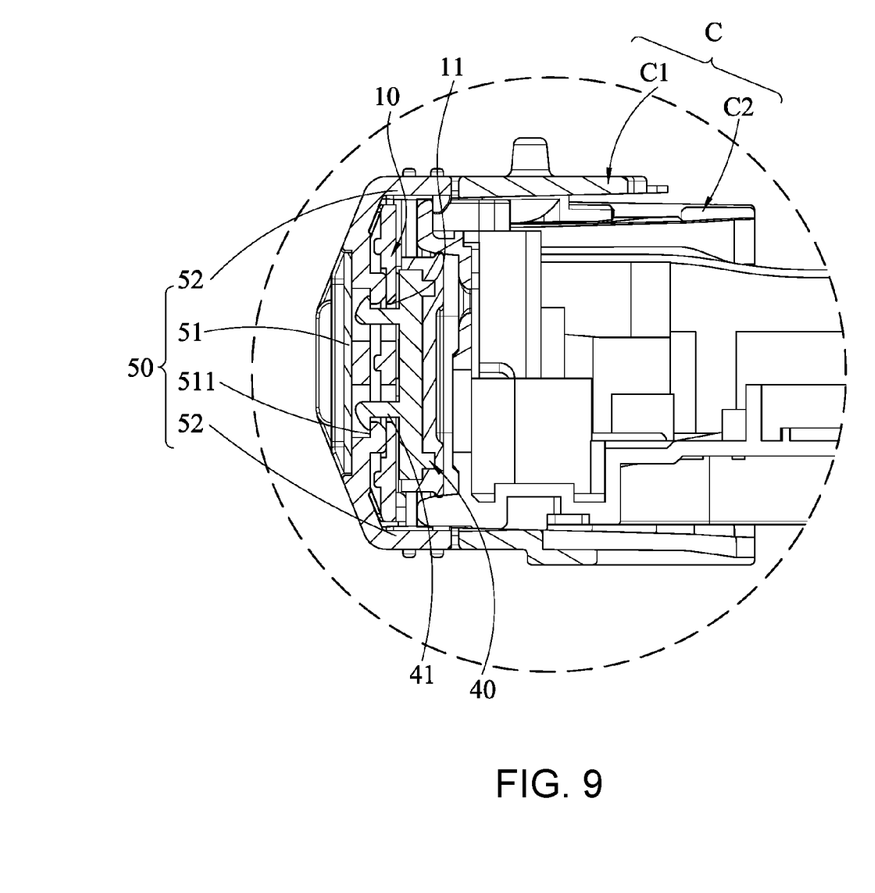
FIG. 9 is a partial enlarged planar schematic diagram of a circled portion 9 in FIG. 8.

Referring to FIG. 1 to FIG. 9. FIG. 1 shows an exploded perspective structural schematic diagram of an electronic device including a waterproof gate assembly according to an embodiment of the present invention. FIG. 2 shows a first exploded perspective structural schematic diagram of a waterproof gate assembly in coordination with a housing according to an embodiment of the present invention. FIG. 3 shows a second exploded perspective structural schematic diagram of a waterproof gate assembly in coordination with a housing according to an embodiment of the present invention. FIG. 4 shows a perspective appearance schematic diagram of a waterproof gate assembly according to an embodiment of the present invention. FIG. 5 shows a partial structural schematic diagram of a waterproof gate assembly mounted to a housing according to an embodiment of the present invention. FIG. 6 shows a section schematic diagram of a waterproof gate assembly mounted to a housing according to an embodiment of the present invention. FIG. 7 shows a partial enlarged schematic diagram of a circled portion 7 in FIG. 6. FIG. 8 shows a perspective section schematic diagram of a waterproof gate assembly mounted in coordination with a slide fastener to a housing according to an embodiment of the present invention. FIG. 9 shows a partial enlarged planar schematic diagram of a circled portion 9 in FIG. 8.

Referring to FIG. 1 to FIG. 4, the present invention provides a waterproof gate assembly configured to be mounted to a housing C. The waterproof gate assembly includes a cover 10, an installation axle 20 and a fixing member 30. The installation axle 20 is connected to the cover 10, so that the cover 10 is enabled to rotate relative to the installation axle 20. The installation axle 20 includes an axial groove 21, an engaging structure 22 and a fixing structure 23. The axial groove 21 is connected to the cover 10, and includes a first end portion 211 and a second end portion 212. The engaging structure 22 is connected to one side of the axial groove 21 corresponding to the cover 10, extends to the first end portion 211 of the axial groove 21, and is configured to be engaged at the housing C. The fixing structure 23 is connected to the one side of the axial groove 21 corresponding to the cover 10, and is close to the second end portion 212 of the axial groove 21. The fixing member 30 passes through the fixing structure 23 and is fixed at the housing C.

Thus, the waterproof gate assembly can be separately assembled to the housing C, and can be readily maintained or replaced.

It should be noted that, in some embodiments, the fixing structure 23 of the waterproof gate assembly is not necessarily fixed at the housing C via the fixing member 30, and the fixing structure 23 can be directly fixed at the housing by means of fitting or embedding; the present invention is not limited to the examples above.

Referring to FIG. 1 to FIG. 3, in some embodiments, the waterproof gate assembly is a part of the electronic device. In these embodiments, the electronic device includes the housing C and two waterproof gate assemblies. The housing C includes a side cover C1 and an inner frame C2. The side cover C1 has two penetrating mounting openings C11, the inner frame C2 has two penetrating ports C21, and the side cover C1 is arranged on one side of the inner frame C2 and the positions of the mounting openings C11 correspond to the positions of the ports C21. The waterproof gate assemblies can be separately detachably arranged at the side cover C1 and correspond to the positions of the mounting openings C11. Herein, connectors, for example but not limited to, USB Type A, micro USB type C, VGA, DVI, HDMI, DisplayPort, Mini DisplayPort, RJ45, RJ11, RS232 or embedded cards (SD, mini SD, micro SD and RF), can be provided at the ports C21 in the electronic device.

Referring to FIG. 3 and FIG. 4, in some embodiments, the cover 10 and the installation axle 20 of the waterproof gate assembly are an integral plate structure. The cover 10 is for covering the mounting opening C11 and the port C21 so as to provide a waterproof or dustproof effect.

Referring to FIG. 2 to FIG. 4, the installation axle 20 is connected on one side of the cover 10 and is for installing on the side cover C1. In some embodiments, a mounting surface C12 is present between the two mounting openings C11 of the side cover C1. When the cover 10 covers the mounting openings C11, the installation axle 20 on one side of the cover 10 has its position corresponding to the position of the mounting surface C12 and can thus be assembled at the mounting surface C12.

Referring to FIG. 2, in an embodiment where the electronic device is provided with two waterproof gate assemblies, the installation axles 20 of both the waterproof gate assemblies are connected to the same mounting surface C12. In these embodiments, when the two waterproof gate assemblies are respectively fixed to the same mounting surface C12 by the installation axles 20, the installation axles 20 of the two waterproof gate assemblies abut against each other, and the installation axles 20 of the two waterproof gate assemblies are arranged in a mutually embedded manner on the mounting surface C12.

The installation axle 20 is connected to one side of the cover 10 by the axial groove 21, and the axial groove 21 extends in an axial direction X by an extension length and includes the first end portion 211 and the second end portion 212. With the axial groove 21 provided between the installation axle 20 and the cover 10, the cover 10 is enabled to rotate along the axial groove 21 relative to the installation axle 20, thereby allowing a user to pivotally rotate the cover 10 according to requirements and to change a shielding or open state of the cover 10 relative to the mounting openings C11.

As shown in FIG. 3, in some embodiments, the fixing member 30 is a screw bolt, and a fixing portion C121 in the form of a screw hole is provided on the mounting surface C12 of the side cover C1 of the housing C. The fixing member 30 extends in a first radial direction Y1 perpendicular to the axial direction X, and the waterproof gate assembly passes through the fixing structure 23 via the fixing member 30 and is locked on the fixing portion C121 on the mounting surface C12 of the side cover C1.

Referring to FIG. 3 and FIG. 4, the engaging structure 22 in overall extends in the axial direction X and has one end connected to the first end portion 211 of the axial groove 21. The length of the overall engaging structure 22 in the axial direction X is less than the length of the axial groove 21 in the axial direction X. In some embodiments, the length of the overall engaging structure 22 in the axial direction X is 15% to 20% of the length of the axial groove 21 in the axial direction X.

In these embodiments, the engaging structure 22 includes an extension section 221 and a hook portion 222 joined with each other. One end of the extension section 221 is connected to the axial groove 21 and extends in the first radial direction Y1, and the other end of the extension section 221 is connected to the hook portion 222. The hook portion 222 extends in a second radial direction Y2 perpendicular to the first radial direction Y1, and the hook portion 222 is enabled to be caught at the side cover C1 of the housing C through the engaging structure 22.

Referring to FIG. 5 to FIG. 7, in some embodiments, in order to reinforce the stability of the cover 10 installed on the side cover C1, the mounting surface C12 of the side cover C1 of the housing C includes a first stop portion C13 for catching the engaging structure 22. In these embodiments, the first stop portion C13 appears as a column structure that extends by a length in the axial direction X. When the cover 10 is installed on the side cover C1, the cover 10 is located on one side of the first stop portion C13, and the hook portion 222 of the engaging structure 22 extends to the other side of the first stop portion C13 and is caught at the first stop portion C13.

In these embodiments, the side cover C1 further includes two abutting surfaces C14, and the two abutting surfaces C14 are connected perpendicularly to two ends of the mounting surface C12 in the axial direction X. One end of the first stop portion C13 in the axial direction X extends to one of the abutting surfaces C14, the other end of the first stop portion C13 in the axial direction C1 has an end surface C131, and the end surface C131 of the first stop portion C13 corresponds to the abutting surface C14. Thus, the end surface C131 of the first stop portion C13 and the abutting surface C14 define an opening C132 in between. As such, when the hook portion 222 of the engaging structure 22 is inserted in the opening C132 of the first stop portion C13, the end surface C131 of the first stop portion C13 and the abutting surface C14 of the side cover C1 are capable of limiting the displacement of the engaging structure 22 in the axial direction X1, enhancing the stability of the cover 10 installed on the side cover C1. Moreover, the first end portion 211 of the axial groove 21 is caught at the first stop portion C13 via the engaging structure 22, and the second end portion 212 of the axial groove 21 is locked and fixed via the fixing member 30 to further provide a fixing effect.

In an embodiment where the electronic device is provided with two waterproof gate assemblies, because the installation axles 20 of the two waterproof gate assemblies are connected to the same mounting surface C12, the two waterproof gate assemblies connected to the same mounting surface C12 exhibit different orientation from each other in order to more comprehensively utilize the mounting surface C12. In these embodiments, the two waterproof gate assemblies are in a state of 180-degree deflection; more specifically, one between the waterproof gate assemblies becomes in the orientation of the other waterproof gate assembly when pivotally rotated by 180 degrees about the first radial direction Y1 as a rotation axis. As such, when the installation axles 20 of the two waterproof gate assemblies are connected to the same mounting surface C12, the fixing structures 23 of the installation axles 20 of the two waterproof gate assemblies become a state of a staggered arrangement on the mounting surface C12 in the axial direction X, wherein the fixing structure 23 of one waterproof gate assembly is neighboring to the engaging structure 22 of the other waterproof gate assembly on the same position in the axial direction X.

Correspondingly, in order to coordinate with the arrangement of the above waterproof gate assemblies on the mounting surfaces C12, the first stop portions C13 on the mounting surfaces C12 are respectively located on different positions in the axial direction X, and each first stop portion C13 is neighboring to the second stop portion C15 on the same position in the axial direction X. As such, from perspectives of FIG. 6 and FIG. 7, FIG. 6 and FIG. 7 show section diagram of the same position in the axial direction X1 on the mounting surface C12, and so the neighboring first stop portion C13 and second stop portion C15 are seen from FIG.

6 and FIG. 7. In FIG. 6 and FIG. 7, it is shown that the first stop portion C13 coordinates with one of the two waterproof gate assemblies, and the second stop portion C15 coordinates with the other one of the two waterproof gate assemblies.

Referring to FIG. 5 to FIG. 7, in some embodiments, to further enhance the stability of the cover 10 installed on the side cover C1, the first stop portion C13 has a peripheral surface C133, and the peripheral surface C133 is connected between two ends of the first stop portion C13 in the axial direction X and corresponds to the opening C132 in the second radial direction Y2. Thus, when the hook portion 222 of the engaging structure 22 is inserted in the opening C132 of the first stop portion C13, the peripheral surface C133 of the first stop portion C13 is capable of limiting the displacement of the engaging structure 22 in the second radial direction Y2, further enhancing the stability of the cover 10 installed on the side cover C1.

Referring to FIG. 5 to FIG. 7, in some embodiments, to ensure the operation smoothness of the engaging structure 22 engaged with the first stop portion C13, the peripheral surface C133 of the first stop portion C13 has an arc section C1331, and the arc section C1331 is adjacent to the opening C132. Moreover, the hook portion 222 of the engaging structure 22 has an inclined surface 2221. Thus, during the catching process of the engaging structure 22 into the first stop portion C13, the engaging structure 22 can be installed in an orientation corresponding to the arc section C1331 of the peripheral surface C133 of the first stop portion C13 through the inclined surface 2221, and the inclined surface 2221 of the engaging structure 22 and the arc section C1331 of the first stop portion C13 can guide each other to collaterally enable to the hook portion 222 of the engaging structure 22 to be caught in the opening 132C, reducing installation complications and improving installation convenience.

Referring to FIG. 5 to FIG. 7, in some embodiments, to further enhance the stability of the cover 10 having been installed on the side cover C1, the side cover C1 of the housing C further includes the second stop portion C15. The second stop portion C15 protrudes from the mounting surface C12 and has an abutting surface C1521 perpendicular to the mounting surface C12, and the installation axle 20 includes a concave portion 24. When the cover 10 is installed on the side cover C1 via the installation axle 20, the concave portion 24 of the installation axle 20 abuts against the abutting surface C1521 of the second stop portion C15. Thus, the displacement of the installation axle 20 in the axial direction X is limited by the second stop portion C15, enhancing the stability of the cover 10 installed on the side cover C1 via the installation axle 20.

In these embodiments, the second stop portion C15 includes a first part C151 and a second part C152 joined with each other. The first part C151 is connected to the mounting surface C12 of the side cover C1 of the housing C and extends in the first radial direction Y1, the second part C152 extends in the second radial direction Y2, and the abutting surface C1521 is located at the second part C152 and is parallel to the abutting surface C14 of the side cover C1. Moreover, as shown in FIG. 3 and FIG. 4, the concave portion 24 of the installation axle 20 is on one side of the installation axle corresponding to the cover 10, and from the perspective of the position in the axial direction X, the second end portion 212 of the axial groove 21 is closer to the concave portion 24 of the installation axle 20 than the first end portion 211. Thus, the coordination and limitation provided by the concave portion 24 of the installation axle 20 and the second stop portion C15 further enhance the stability of the cover 10 installed on the side cover C1 via the installation axle 20.

Referring to FIG. 1 and FIG. 2, in some embodiments, the waterproof gate assembly further includes a sealing plug 40, and the shape of the sealing plug 40 corresponds to the shape of the port C21 of the inner frame C2 of the housing C. When the electronic device demands high levels of waterproofness, high levels of utilization security and high levels of confidentiality, the sealing plug 40 is arranged at the port C21 to seal the port C21, thus preventing moisture from entering, and confidential data in the electronic device from theft, as well as unintentional opening of the cover 10 that may cause risks of flash gas explosion.

In these embodiments, to enhance the stability of sealing plug 40, the sealing plug 40 includes a plurality of catches 41. The catches 41 protrudes from a surface of the sealing plug 40, and the cover 10 is provided with positioning holes 11 corresponding to the number and positions of the catches 41. When the cover 10 is installed on the side cover C1 via the installation axle 20, the catches 41 of the sealing plug 40 pass through and are hooked at the positioning holes 11 of the cover 10, thereby enhancing the stability of the sealing plug 40.

Referring to FIG. 1 and FIG. 2 as well as FIG. 8 and FIG. 9, in some embodiments, to further improve the utilization security and sealing ability of the waterproof gate assembly, the waterproof gate assembly further includes a slide fastener 50. The slide fastener 50 is a U-shaped cover structure, and includes a face portion 51 and two opposite side portions 52. The face portion 51 of the slide fastener 50 includes a sleeve groove 511, the slide fastener 50 is slidably sleeved, via the sleeve groove 511, at the catches 41 of the sealing plug 40 passing through the positioning holes 11 of the cover 10, and the two side portions 52 of the slide fastener 50 are slidably sleeved in the inner frame C2 and are movable between a released position and a locked position. Thus, when the cover 10 does not need to be opened, the slide fastener 50 can be moved to the locked position to lock the inner frame C2 and shield the cover 10; when the cover 10 needs to be opened, the slide fastener 50 is moved to the released position to release the inner frame C2 and to open the cover 10, so that a user is allowed to release or lock the slide fastener 50 according to requirements to enhance utilization security.

In some embodiments, the electronic device above is for example, a laptop computer, a tablet computer, a keyboard, a keyboard expansion dock, a camera or a cellphone.

The present disclosure is disclosed as the embodiments above. However, these embodiments are not to be construed as limitation to the present disclosure. Slight modifications and variations may be made by a person skilled in the art without departing from the spirit and scope of the present disclosure. Therefore, the scope of protection of the present application should be accorded with the broadest interpretation of the appended claims.

What is claimed is:

1. A waterproof gate assembly, configured to be mounted to a housing, the waterproof gate assembly comprising:
   a cover;
   an installation axle connected to the cover and enabling the cover to rotate relative to the installation axle, the installation axle comprising:
   an axial groove connected to the cover, the axial groove comprising a first end portion and a second end portion;

an engaging structure connected to one side of the axial groove corresponding to the cover and extending to the first end portion of the axial groove, the engaging structure configured to be engaged at the housing; and a fixing structure connected to the one side of the axial groove connected to the engaging structure and corresponding to the cover, and being close to the second end portion of the axial groove; and a fixing member passing through the fixing structure and fixed at the housing;

wherein the axial groove extends in an axial direction, and the fixing structure is located between the second end portion and the engaging structure along the axial direction.

2. The waterproof gate assembly according to claim 1, wherein the fixing member extends in a first radial direction perpendicular to the axial direction, the housing comprises a first stop portion, the engaging structure abuts against the first stop portion, and the first stop portion limits, via the engaging structure, a displacement of the installation axle in the axial direction and the first radial direction.

3. The waterproof gate assembly according to claim 2, wherein the first stop portion has an end surface and an opening, the opening is adjacent to the end surface, and the engaging structure is inserted into the opening.

4. The waterproof gate assembly according to claim 3, wherein the first stop portion has a peripheral surface, and the peripheral surface is connected to a portion of the end surface and defines the opening.

5. The waterproof gate assembly according to claim 4, wherein the peripheral surface has an arc section adjacent to the opening.

6. The waterproof gate assembly according to claim 5, wherein the engaging structure has an inclined surface.

7. The waterproof gate assembly according to claim 1, wherein the housing comprises a second stop portion, the installation axle comprises a concave portion, the second stop portion has an abutting surface, the concave portion abuts against the abutting surface, and the second stop portion limits, via the concave portion, a displacement of the installation axle in the axial direction.

8. The waterproof gate assembly according to claim 7, wherein the concave portion is located on one other side of the installation axle and is away from the first end portion.

9. The waterproof gate assembly according to claim 8, wherein the fixing member extends in a first radial direction perpendicular to the axial direction, a direction perpendicular to the axial direction and the first radial direction is defined as a second radial direction, the second stop portion comprises a first part and a second part joined with each other, the first part is connected to the housing and extends in the first radial direction, the second part extends in the second radial direction, and the abutting surface is located at the second part.

10. The waterproof gate assembly according to claim 1, wherein the housing comprises a first stop portion and a second stop portion, the installation axle comprises a concave portion, the engaging structure abuts against the first stop portion, and the concave portion abuts against the second stop portion.

11. An electronic device, comprising:
a housing having a side cover; and
a waterproof gate assembly mounted to the housing, the waterproof gate assembly comprising:
a cover;

an installation axle connected to the cover and enabling the cover to rotate relative to the installation axle, the installation axle comprising:

an axial groove connected to the cover, the axial groove comprising a first end portion and a second end portion;

an engaging structure connected to one side of the axial groove corresponding to the cover and extending to the first end portion of the axial groove, the engaging structure configured to be caught at the side cover; and a fixing structure connected to the one side of the axial groove connected to the engaging structure and corresponding to the cover, and being close to the second end portion of the axial groove; and a fixing member passing through the fixing structure and fixed at the side cover;

wherein the axial groove extends in an axial direction, and the fixing structure is located between the second end portion and the engaging structure along the axial direction.

12. The electronic device according to claim 11, wherein the fixing member extends in a first radial direction perpendicular to the axial direction, the side cover comprises a first stop portion, the engaging structure abuts against the first stop portion, and the first stop portion limits, via the engaging structure, a displacement of the installation axle in the axial direction and the first radial direction.

13. The electronic device according to claim 12, wherein the first stop portion has an end surface and an opening, the opening is adjacent to the end surface, and the engaging structure is inserted into the opening.

14. The electronic device according to claim 11, wherein the housing comprises a second stop portion, the installation axle comprises a concave portion, the second stop portion has an abutting surface, and the concave portion abuts against the abutting surface.

15. The electronic device according to claim 14, wherein the concave portion is located on one other side of the installation axle and is away from the first end portion.

16. The electronic device according to claim 14, wherein the fixing member extends in a first radial direction perpendicular to the axial direction, a direction perpendicular to the axial direction and the first radial direction is defined as a second radial direction, the second stop portion comprises a first part and a second part joined with each other, the first part is connected to the housing and extends in the first radial direction, the second part extends in the second radial direction, and the abutting surface is located at the second part.

17. The electronic device according to claim 11, wherein the housing further has a port, the waterproof gate assembly further comprises a sealing plug, and the sealing plug is configured to seal the port.

18. The electronic device according to claim 11, wherein the waterproof gate assembly further comprises a slide fastener, and the slide fastener is assembled on the cover.

19. An electronic device, comprising:
a housing having a side cover; and
a waterproof gate assembly mounted to the housing, the waterproof gate assembly comprising:
a cover; and
an installation axle connected to the cover and fixed on the side cover and enabling the cover to rotate relative to the installation axle, the installation axle comprising:

an axial groove connected to the cover, the axial groove comprising a first end portion and a second end portion;

an engaging structure connected to one side of the axial groove corresponding to the cover and extending to the first end portion of the axial groove, the engaging structure configured to be caught at the side cover; and a fixing structure connected to the one side of the axial groove connected to the engaging structure and corresponding to the cover, and being close to the second end portion of the axial groove;

wherein the axial groove extends in an axial direction, and the fixing structure is located between the second end portion and the engaging structure along the axial direction.

20. The electronic device according to claim 19, wherein the housing comprises a first stop portion and a second stop portion, the installation axle comprises a concave portion, the engaging structure abuts against the first stop portion, and the concave portion abuts against the second stop portion.

\* \* \* \* \*